United States Patent [19]

Carroll et al.

[11] Patent Number: 5,055,991
[45] Date of Patent: Oct. 8, 1991

[54] LOSSLESS SNUBBER

[75] Inventors: Barry N. Carroll; Jean H. Ho, both of The Woodlands, Tex.

[73] Assignee: Compaq Computer Corporation, Houston, Tex.

[21] Appl. No.: 596,233

[22] Filed: Oct. 12, 1990

[51] Int. Cl.[5] .............................. H02H 7/122
[52] U.S. Cl. ...................... 363/56; 363/21; 361/91; 361/111
[58] Field of Search ............... 363/55–58, 363/20, 21; 361/90, 91, 111

[56] References Cited

U.S. PATENT DOCUMENTS

| 4,268,898 | 5/1981 | Brown | 363/56 X |
|---|---|---|---|
| 4,365,171 | 12/1982 | Archer | 361/91 X |
| 4,438,485 | 3/1984 | Voight | 363/21 |
| 4,561,046 | 12/1985 | Kuster | 363/56 X |
| 4,675,796 | 6/1987 | Gautherin et al. | 363/56 X |
| 4,760,512 | 7/1988 | Loftus | 363/56 X |
| 4,772,810 | 9/1988 | Felps | 307/253 |
| 4,870,554 | 9/1989 | Smith | 363/56 X |
| 4,977,493 | 12/1990 | Smith | 363/126 |

Primary Examiner—Steven L. Stephan
Assistant Examiner—Emmanuel Todd Voeltz
Attorney, Agent, or Firm—Pravel, Gambrell, Hewitt, Kimball & Krieger

[57] ABSTRACT

A capacitor connected directly across the terminals of the primary inductance of a transformer of a switched mode power supply and a separately wound inductor connected between the primary inductance and the switching power transistor which form a lossless snubber circuit. The snubber circuit is more efficient since resistors are not used to dissipate the energy as unwanted heat. The capacitor increases the transistor turn off voltage rise time, thereby reducing radiated emissions. The inductor reduces emissions appreciably by absorbing the ringing that would otherwise occur after the transistor is turned fully off and increases the transistor turn on time.

2 Claims, 2 Drawing Sheets 5,055,991

LOSSLESS SNUBBER

BACKGROUND OF THE INVENTION

1. Field of the Invention

The present invention relates to a snubber circuit used to reduce stress on a switching transistor and to increase overall efficiency of a switched mode power supply.

2. Description of Related Art

Computer systems are getting smaller and more complex. DC converters or switched mode power supplies are used to provide power to computer systems since the high frequencies require smaller and lighter power transformers and filtering components. In general, a switched mode power supply converts ac voltage to a dc source voltage, which is connected to one terminal of the primary inductance of a transformer. The other terminal of the primary inductance is connected to a transistor switch which provides a conductive path back to the return of the dc source voltage. The transistor switch controls the current through the primary inductance of the transformer. When the transistor switch is turned on, the switch is closed so that current can flow from the dc source voltage through the primary inductance of the transformer and through the transistor switch and back to the return of the dc source voltage. When the transistor switch is turned off, the switch is opened so that it interrupts the current flow through the transistor switch and primary inductance of the transformer. Energy from the current flow is transferred through the transformer to the secondary inductance to the output circuit which provides a regulated voltage source at the output of the power supply. A pulse width modulator (PWM) circuit monitors the output voltage through a feedback circuit and generates the activation signal which is connected to the control terminal of the transistor switch to turn it on and off as required. The activation signal is a square wave, the frequency of which is determined by an internal oscillator of the PWM. When the signal goes high the transistor switch turns on allowing current flow, and when the signal goes low, the transistor switch turns off. The time from turn on to turn off in each cycle is referred to as the pulse width. If the output voltage level begins to drop, the PWM circuit increases the width of each pulse, thereby turning the transistor switch on longer in a given cycle, which allows greater power to be transferred to the output circuit which eventually increases the output voltage to return it back to the proper level.

The transistor switch undergoes stress while switching since the transformer inductances resist any changes in current. As the transistor is turning off, the resistance of the conductive path through the transistor increases rapidly until the conductive path is essentially cut off. As the conductive path through the transistor is being cut off, the current through the primary inductance must be diverted away from the transistor switch and eliminated before the next cycle begins. A snubber circuit diverts the current away from the switching transistor and absorbs this extraneous energy. The snubber circuit of prior art diverts this current through a resistor which converts the energy into unwanted heat. This heat energy must be dissipated quickly to prevent the power supply from overheating. The resistors and the components used in prior art to dissipate the heat energy consume valuable space and increase the cost of the power supply. Furthermore, this energy converted to heat is lost, thereby reducing the overall efficiency.

When the switching transistor is turning off, a voltage spike appears across the primary inductance due to leakage inductance, which creates stress on the transistor which could destroy the transistor if the voltage surpasses its maximum voltage rating. A clamp circuit reduces the peak voltage of the voltage spike by clamping the voltage across the primary inductance to the dc source voltage level. A lossy clamp would convert the energy in this voltage spike to heat by placing the voltage across a resistor. This added heat is not desirable and further decreases the efficiency of the power supply.

SUMMARY OF THE INVENTION

The lossless snubber circuit of the present invention reduces stress on the switching transistor and increases the overall efficiency of the switched mode power supply. It also reduces conducted and radiated electromagnetic interference (EMI) significantly and dissipates a smaller amount of energy than the conventional snubber circuit. The snubber circuit of the present invention includes a snubber capacitor connected so as to be in parallel with the primary inductance of the transformer, and a separately wound snubber inductor in series between the primary inductance and the transistor switch. When the transistor is turned on, current flows through the primary inductance and the snubber inductance and the capacitor charges to the voltage across the primary inductance. When the transistor begins to turn off, the current decreases rapidly, causing the voltage across the primary inductance to reverse polarity. The capacitor resists this sudden change in voltage and must charge to the opposite polarity, thereby limiting the rate of change of the voltage across the primary inductance. This, in turn, limits the rate of rise of the voltage at the switching transistor which reduces the radiated emissions. Furthermore, the snubber capacitor retains this charge until the next cycle begins and the transistor turns on again, such that this charge is dumped into the primary inductance and thus stored in the transformer. Most of this energy is, therefore, not lost to heat but is transferred to the output of the power supply, thereby increasing the efficiency. The snubber capacitor also adds to the switching losses of the transistor without dissipating much power itself.

The snubber inductor absorbs ringing once the transistor is fully off which reduces conducted emissions. The amount of power dissipated in the series inductor is relatively small and thus dissipates little heat. When the transistor switch begins to turn on again, the snubber inductor initially represents a high impedance since there is no current flowing through it. This impedance increases the amount of time it takes to turn the transistor on, until the series inductor saturates. The snubber inductor also prevents the transistor from shorting the snubber capacitor to the return of the dc source voltage when the transistor is turned on.

The lossless clamp circuit consists of a diode and an inductance wound on the same core but coupled out of phase with the primary inductance of the transformer. The diode and the coupled inductance are connected in series between the dc source voltage and the return.

While the transistor is on, the voltage induced across the coupled inductance reverse biases the diode preventing current from flowing through the clamp circuit. When the transistor is turned off, the polarity of the coupled inductance reverses, which forward biases the diode and allows current to flow through the clamp circuit. The voltage across the coupled inductance is clamped to the dc source voltage minus the forward bias voltage of the diode. The primary inductance will likewise be clamped to the dc voltage source since the inductances are coupled. Any voltage produced from leakage inductance is reduced and the energy is absorbed by the dc source voltage supply. This energy is, therefore, not diverted into a resistor and converted to unwanted heat but is fed back to the dc source to be used again. This increases the efficiency of the power supply since energy is saved and not dissipated as heat.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
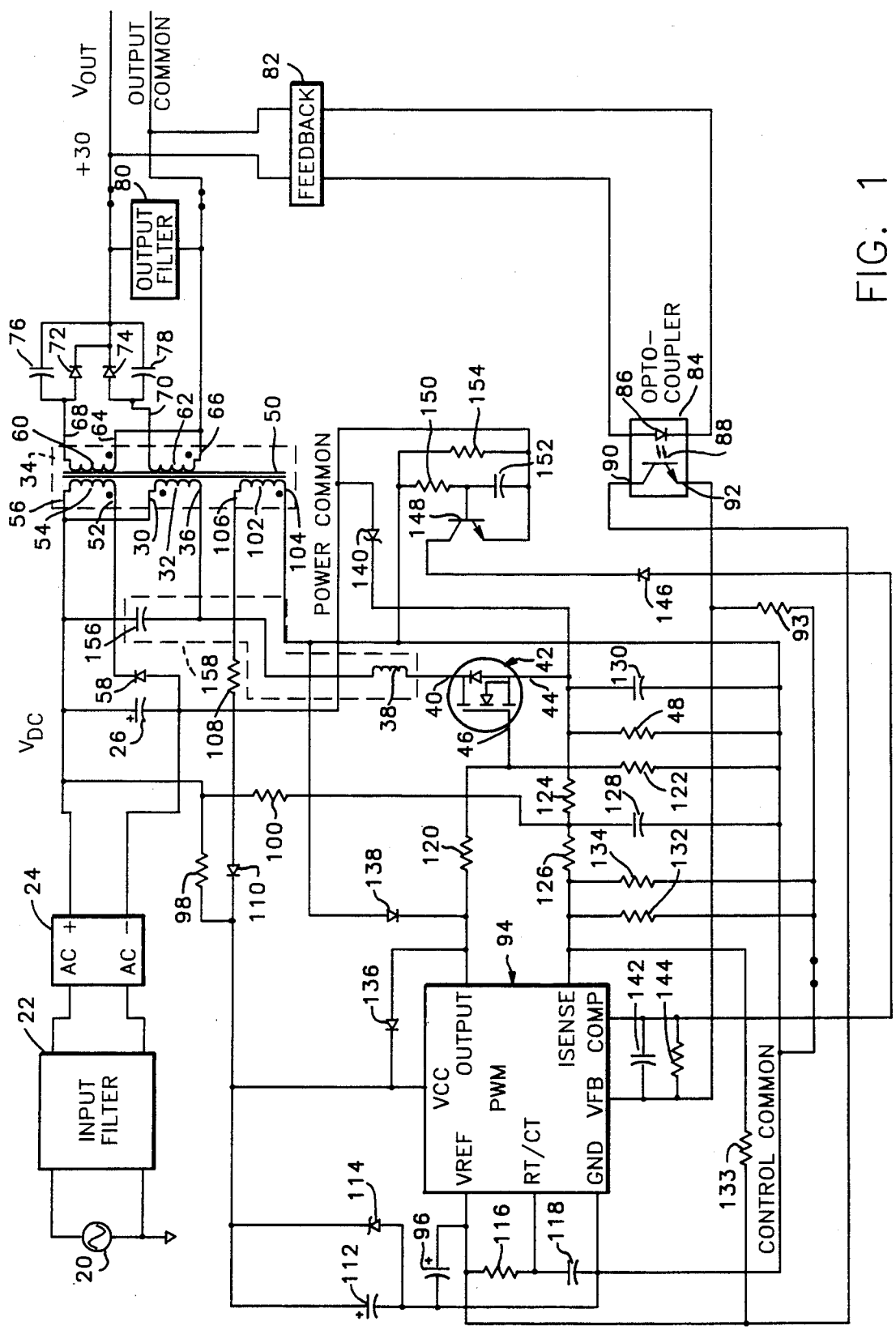
FIG. 1 is a schematic diagram of a switched mode power supply using a flyback converter and the snubber circuit of the present invention.

FIG. 1 is a schematic diagram of a switched mode power supply using a flyback converter and the snubber circuit of the present invention. An ac source 20 is connected to an input EMI filter 22, whose outputs are connected across a full wave bridge rectifier 24. The positive side of the output of the full wave rectifier 24 is referred to as VDC and is the dc source voltage of the switched mode power supply, and the negative, or return side of the output of bridge 24 is referred to as POWER COMMON. A capacitor 26 is a filter capacitor for the dc source VDC and is connected between VDC and POWER COMMON. The dotted terminal 30 of a primary inductance 32 of a transformer 34 is connected to VDC and the opposite terminal 36 of the primary inductance 32 is connected to one side of a snubber inductor 38. The other side of the snubber inductor 38 is connected to the input terminal 40 of the switching transistor 42 and the output terminal 44 of the transistor 42 is connected to one side of the current sense resistor 48. The other side of the current sense resistor 48 is connected to a line referred to as CONTROL COMMON. Preferably the switching transistor 42 is a MOSFET to allow simplification of control circuitry and increase in efficiency of the power supply.

When the transistor switch 42 is turned on, current flows from VDC through the primary inductance 32, through the snubber inductor 38, through the switching transistor 42 and finally through the current sense resistor 48 to CONTROL COMMON. The energy from this current flow through the primary inductance 32 is stored in the core 50 of the transformer 34 during the time that the transistor 42 is turned on. When current flows through the primary inductance 32, the voltage across it is sensed positively at the dotted terminal 30, and since the primary inductance 32 and a coupled inductance 54 are wound around the same core 50 of the transformer 34, a voltage appears across the coupled inductance 54 sensed positively at its dotted terminal 52. The dotted terminal 52 of the coupled inductance 54 is connected to the cathode of a diode 58 and the other terminal 56 of the coupled inductance 54 is connected to VDC. The anode of diode 58 is connected to POWER COMMON. Since the voltage appearing across the coupled inductance 54 is sensed positively at its dotted terminal 52, the diode 58 is reversed biased so that current does not flow through the coupled inductance 54 while the transistor 42 is on. In a similar manner, proportional voltages appear across secondary inductances 60 and 62 of the transformer 34, which are sensed positively at the dotted terminals 64 and 66, respectively.

The opposite terminal 68 of the secondary inductance 60 is connected to the anode of a diode 72 and the opposite terminal 70 of the secondary inductance 62 is connected to the anode of a diode 74. The cathodes of the diodes 72 and 74 are connected together and this signal is the output voltage referred to as $V_{OUT}$. A capacitor 76 is connected in parallel with the diode 72, and a capacitor 78 is connected in parallel with diode 74, the capacitors 76 and 78 providing EMI reduction. The dotted terminal 64 of the inductance 60 and the dotted terminal 66 of the inductance 62 are connected together and this signal is referred to as OUTPUT COMMON. An output filter 80 is connected between $V_{OUT}$ and OUTPUT COMMON which provides filtering for the output voltage of the power supply.

While the transistor 42 is on, the voltages appearing across the secondary inductances 60 and 62, sensed positively at the dotted terminals 64 and 66, respectively, reverse bias the diodes 72 and 74 such that current does not flow through the inductances 60 and 62. When the transistor switch 42 begins to turn off, the resistance between its input terminal 40 and output terminal 44 increases dramatically, which resists the flow of current through the primary inductance 32 causing this current to decrease rapidly. Since the voltage across an inductor is proportional to the change of current through it, the voltage across the primary inductance 32 reverses polarity so that the voltage is sensed negatively at its dotted terminal 30. The voltage across the coupled inductance 54 will thus be clamped to the voltage between VDC and POWER COMMON minus the voltage drop across the diode 58. Since the primary inductance 32 is coupled with the coupled inductance 54, the primary inductance 32 is also clamped to the voltage VDC minus the voltage drop across the diode 58. The voltage spike produced by leakage inductance during transistor switching is, therefore, reduced by the clamp circuit formed by the diode 58 and the coupling inductance 54. This energy is transferred to and absorbed in the VDC voltage supply. This increases the efficiency of the power supply since this energy is not lost by heat dissipation through a resistor, which will be explained in the discussion of FIG. 2. This voltage spike would otherwise increase the voltage at the input terminal 40 of the transistor 42 and potentially surpass the maximum voltage rating of the transistor 42.

Because the secondary inductances 60 and 62 are coupled to the primary inductance 32, the voltages across the secondary inductances 60 and 62 also reverse polarity when the transistor switch 42 turns off, so that they are negatively sensed at their dotted terminals 64 and 66, respectively, such that the diodes 72 and 74 are forward biased, allowing current to flow through the secondary inductances 60 and 62 through diodes 72 and 74 to $V_{OUT}$. Therefore, while the transistor switch 42 is turned off, the energy stored in the core 50 of transformer 34 is transferred to the output of the switched mode power supply.

In a like manner, the voltage across the coupled inductance 54 reverses polarity when transistor switch 42 is turning off, causing it to be negatively sensed at its dotted terminal 52. The diode 58 is then forward biased, which allows current to flow through it and through the inductance 54.

The output voltage between $V_{OUT}$ and OUTPUT COMMON is input to a feedback circuit 82 which converts the output voltage to a proportional current. The feedback circuit supplies this current to the anode of the internal light emitting diode (LED) 86 of an opto-coupler 84. The cathode of the LED 86 is connected to the return of the feedback circuit 82. The opto-coupler 84 isolates the output circuit from the switching frequencies of a pulse width modulation controller (PWM) 94 contained in the power supply and provides ground isolation. The PWM 94 provides the necessary control capabilities required in a switched mode power supply, primarily related to activating the transistor switch 42 to provide a proper output voltage. The features and operation of the PWM 42 are considered well known to those skilled in the art and are discussed here for clarity of the present invention. The use of alternate PWM techniques and controls are readily discerned and understood by those skilled in the art and may be used with the present invention. The input or collector terminal 90 of the internal transistor 88 of the opto-coupler 84 is connected to the VREF or voltage reference output of the PWM 94. The output or emitter 92 of the transistor 88 is connected to the VFB or voltage feedback input of the PWM 94. A resistor 93 is connected between PWM 94 input VFB and CONTROL COMMON. As current flows through the LED 86, it activates the transistor 88 which sets up a voltage across the resistor 93 which is proportional to the output voltage $V_{OUT}$. The PWM 94 has an internal comparator that compares the VREF voltage with the proportional voltage appearing at the VFB input of the PWM 94, so that the PWM 94 can monitor $V_{OUT}$ and determine the pulse width required. In the preferred embodiment, VREF is 2.5 volts. A filter capacitor 96 is connected between VREF and CONTROL COMMON.

The VCC or supply voltage input of the PWM 94 is connected to one side of resistor 98 and the other side of resistor 98 is connected to the dc source voltage VDC. VDC supplies power to the PWM 94 at the initial or start-up stages of the power supply. The dotted terminal 104 of another inductance 102 of the transformer 34 is connected to CONTROL COMMON and the opposite terminal 106 of the inductance 102 is connected to one side of a resistor 108. The other side of the resistor 108 is connected to the anode of a diode 110 and the cathode of the diode 110 is connected to the VCC input of the PWM 94. Once the power supply begins to operate normally, the transformer 34, through the inductance 102, supplies power to the PWM 94. The diode 110 is a half-wave rectifier to prevent negative voltage from reaching the PWM 94. A capacitor 112 is connected between the VCC and the GND inputs of PWM 94 to filter the supply voltage to the PWM 94 and to supply the drive current for the transistor 42. The GND input of PWM 94 is connected to CONTROL COMMON. The anode of a Zener diode 114 is connected to the GND input of PWM 94 and the cathode is connected to the VCC of the PWM 94 to protect the PWM 94 from high voltage.

A resistor 116 is connected between the VREF and RT/CT inputs of the PWM 94 and a capacitor 118 is connected between the GND and RT/CT inputs of PWM 94. The resistor 116 and capacitor 118 determine the frequency of the activation square wave output of the PWM 94. A resistor 120 is connected between the output of the PWM 94 and the control terminal 46, the gate in the preferred embodiment, of the switching transistor 42. Another resistor 122 is connected between the control terminal 46 of the transistor 42 and CONTROL COMMON to prevent false turn on pulses during start up conditions. When the square wave output of the PWM 94 is high, the voltage is divided through resistors 120 and 122 to the control terminal 46 of the transistor 42 which turns the transistor 42 on. When the PWM output is low, the transistor 42 is turned off.

The anode of a diode 136 is connected to the output of PWM 94 and the cathode of diode 136 is connected to the VCC input of PWM 94. The diode 136 protects the PWM 94 by clamping the output of the PWM 94 to the VCC input. In this way, if the switching transistor 42 is shorted, the output of the PWM 94 will not rise above the VCC input of PWM 94.

The anode of a diode 138 is connected to the dotted terminal 104 of the inductance 102 and the cathode of the diode 138 is connected to the output of the PWM 94. The diode 138 protects the PWM 94 by not allowing the output voltage at the control output of the PWM 94 from going below the CONTROL COMMON level. A Zener diode 140 has its anode connected to POWER COMMON and its cathode connected to the output terminal 44 of the transistor 42 and also acts to protect the PWM 94.

A resistor 126 is connected to the ISENSE or current limit sense input of the PWM 94 and the other side of the resistor 126 is connected to one side of a resistor 124. The other side of resistor 124 is connected to the output terminal 44 of the transistor 42. A resistor 132 and a resistor 134 are power trim resistors connected in parallel between the ISENSE input of the PWM 94 and CONTROL COMMON. A resistor 133 is connected between the ISENSE input and the VREF input. The resistors 132, 133 and 134 are trimmed to precise values so that the voltage at the ISENSE input of the PWM 94 is very precise. When the transistor 42 is turned on, current flows through the sense resistor 48, establishing a voltage across the current sense resistor 48, which is sensed at the ISENSE input of the PWM 94 through the voltage divider formed by resistors 126, 124, 132 and 134. The PWM 94 thus monitors the current flowing through the primary inductance 32 at the ISENSE input. When the current demand becomes too great, the PWM 94 can limit the pulse width to prevent damage to the power supply. One side of a capacitor 128 is connected to the junction between the resistors 126 and 124 and the other side of capacitor 128 is connected to CONTROL COMMON. Another capacitor 130 is connected in parallel with sense resistor 48. The capacitor 128 and capacitor 130 are filter capacitors for the ISENSE input of the PWM 94.

A resistor 100 is connected between the dc source voltage VDC and the junction of the resistors 126 and 124. The resistor 100 serves as feed-forward compensation such that if VDC changes, the current sense monitor of the PWM 94 at input ISENSE will change to counteract the change in VDC. For example, if the voltage of the ac source 20 is lower than normal, such that VDC is lowered accordingly, the ISENSE voltage will also be lowered and the PWM 94 will increase the pulse width to counteract this low voltage condition.

A capacitor 142 and resistor 144 are connected between the VFB and COMP or compensation inputs of the PWM 94. The resistor 144 and capacitor 142 provide negative feedback for an internal error amplifier in the PWM 94 to provide compensation for the voltage feedback loop sensed at the VFB input of the PWM 94.

As explained above, the ISENSE input of the PWM 94 provides a current limit such that the PWM 94 can limit the pulse width if too much current is being demanded at the output of the power supply. The filter capacitors 130 and 128 slow down this feedback loop such that if the output were short circuited, the power supply would be damaged unless a quicker way to shut down the PWM 94 is provided. A diode 146, an NPN transistor 148, a resistor 150, a resistor 154 and a capacitor 152 provide the necessary means to detect this overcurrent situation and quickly shut down the PWM 94. The COMP input of the PWM 94 is connected to the anode of the diode 146 and the cathode of the diode 146 is connected to the collector of the transistor 148. The emitter of the transistor 148 is connected to POWER COMMON. The resistor 154 is connected between POWER COMMON and CONTROL COMMON and the resistor 150 is connected between CONTROL COMMON and the base of the transistor 148. One side of the capacitor 152 is connected to the base of the transistor 148, and the other side of the capacitor 152 is connected to POWER COMMON. When the transistor switch 42 is on, current flows through the current sense resistor 48 and also through the resistor 154 back to POWER COMMON, which is the return signal for the full wave rectifier 24. Under normal operation, the voltage developed across resistor 154 is low, and thus the voltage across the capacitor 152 appearing at the base of transistor 148 is low and the transistor 148 is biased off. If the current demand suddenly increases, the voltage across the resistor 154 increases and turns the transistor 148 on, and this clamps the COMP input of the PWM 94 to POWER COMMON plus the forward bias voltage of diode 146, which shuts down the pulse output of the PWM 94.

Figure 2:
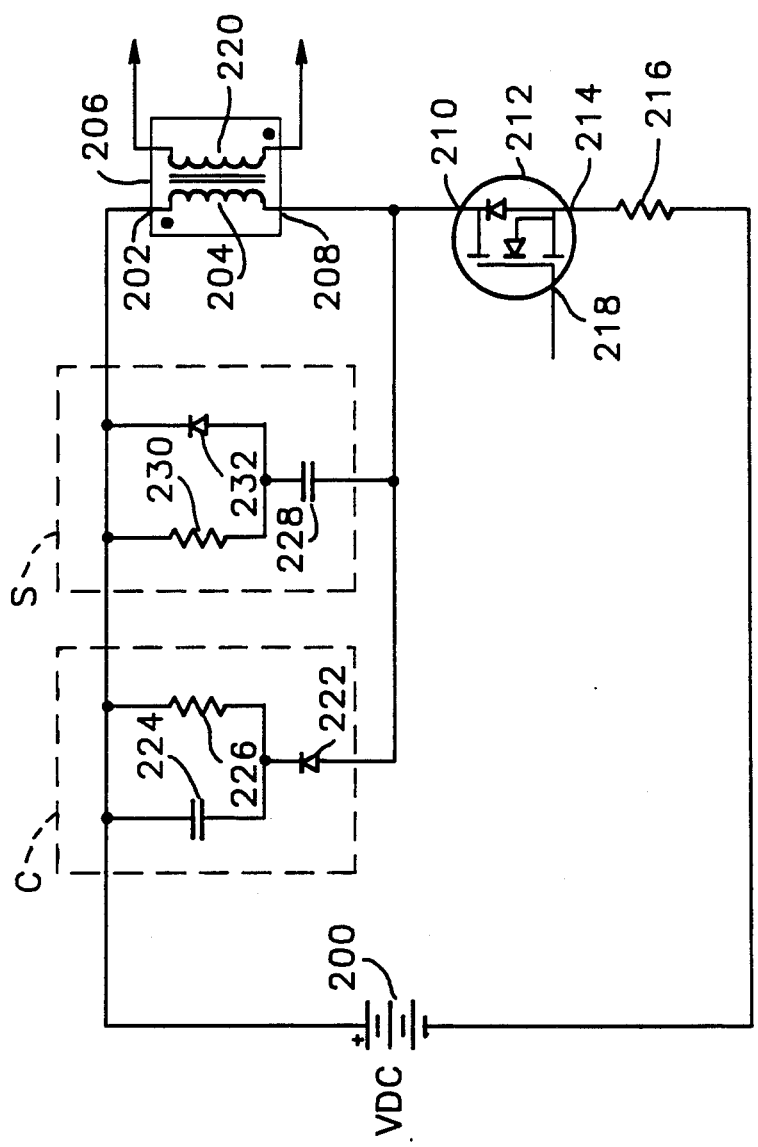
FIG. 2 is a schematic diagram showing the snubber circuit of the prior art, as well as a lossy clamp circuit.

The snubber circuit 158 of the present invention includes the capacitor 156 and the inductor 38. The capacitor is connected between the dotted terminal 30 and the opposite terminal 36 of the primary inductance 32 such that the capacitor 156 is placed in parallel with the primary inductance 32. In order to appreciate the snubber of the present invention, FIG. 2 has been provided which is a schematic of the primary circuit of a switching power supply using the lossy snubber circuit and the lossy clamp circuit of the prior art. Referring to FIG. 2, the dc source voltage VDC has been replaced by a battery 200 for purposes of explanation. The positive side of the battery 200 is connected to the dotted terminal 202 of a primary inductance 204 of a transformer 206 and the opposite terminal 208 of the primary inductance 204 is connected to the drain terminal 210 of a MOSFET transistor 212. The source terminal 214 of the MOSFET transistor 212 is connected to the current sense resistor 216. The other side of the sense resistor 216 is connected to the negative side of the battery 200.

The MOSFET transistor 212 is turned on by applying a high voltage at the gate terminal 218 of the MOSFET transistor 212, and is turned off by applying a low voltage at the gate terminal 218. A PWM circuit using a PWM controller similar to the PWM 94 of FIG. 1 would be connected to the gate 218 of transistor 212 and used to control the turn on and turn off cycles. When the transistor 212 is turned on, current flows through the primary inductance 204 of transformer 206, through transistor 212 and through the current sense resistor 216 in the same way as explained for FIG. 1. Energy again is stored in the transformer 206 while the transistor 212 is on in the flyback mode of operation. The clamp circuit C consists of a diode 222, a capacitor 224 and a clamp resistor 226. The anode of the diode 222 is connected to the drain terminal of the MOSFET transistor 212 and the cathode of the diode 222 is connected to the one end of the capacitor 224 and one end of the clamp resistor 226. The other sides of the capacitor 224 and the clamp resistor 226 are connected to the positive terminal of the battery 200. The lossy clamp circuit functions in a similar manner as the lossless clamp. When the MOSFET transistor 212 is on, current flows through and a voltage appears across the primary inductance 204. This voltage is sensed positively at the dotted terminal 202 such that the diode 222 is reverse biased. Therefore, no current flows through the clamp while MOSFET transistor is on. When the MOSFET transistor turns off, the voltage at the drain terminal 210 rises and if this voltage rises above twice the voltage VDC, diode 222 will be forward biased and turn on, clamping the drain terminal 210 to twice the VDC voltage level. Usually, a voltage spike caused by leakage inductance from the secondary inductance 220 appears at the terminal 208 of primary inductance 208, which could damage the MOSFET transistor 212. It will be appreciated that the voltage spike forward biases diode 222 and much of this energy is then dissipated by the clamp resistor 226 as heat.

The snubber circuit S of prior art consists of a capacitor 228, a snubber resistor 230 and a diode 232. One side of the capacitor 228 is connected to the drain terminal 210 of MOSFET transistor 212 and the other side of the capacitor 226 is connected to one side of the resistor 230 and the anode of the diode 232. The other side of the snubber resistor 230 and the cathode of the diode 232 are connected to the positive terminal of the battery 200. As current is flowing through the primary inductance 204, the diode 232 of the snubber circuit S is turned off, allowing no current to flow through the snubber circuit S. When the MOSFET transistor 212 begins to turn off, the voltage polarity across the primary inductance 204 reverses as described above, which forward biases the diode 232, allowing the current flowing through the primary inductance 204 to be diverted from the MOSFET transistor 212 through the capacitor 228 and through the snubber resistor 230 and the diode 232. It will be appreciated that this energy is absorbed by the snubber resistor 230 and is converted into heat.

The snubber circuit 158 of the present invention is shown in FIG. 1 and will now be described in more detail so that the invention can be fully appreciated. Referring back to FIG. 1, when the switching transistor 42 is turned on, the snubber capacitor 156 will charge to the voltage appearing across the primary inductance 32 sensed positively at the dotted terminal 30. As described above, when the transistor switch 42 begins to turn off, its resistance increases rapidly, thereby causing the current through the primary inductance 32 to decrease rapidly, which causes the voltage across the primary inductance 32 to reverse polarity. The snubber capacitor 156 resists this instantaneous change in voltage and must charge to this opposite polarity. Therefore, much of the current is diverted from the switching transistor 42 to the snubber capacitor 156, which limits the rate of rise of the voltage at the input terminal 40 of transistor 42. The electromagnetic interference and the radiated emissions are therefore reduced. The snubber capacitor 156 reduces stress on the transistor 42 by absorbing much of switching losses that would otherwise be absorbed by the switching transistor 42. Furthermore, the snubber capacitor 156 retains the charge until the next cycle begins, so that this charge is dumped back through the primary inductance 32 and converted to usable energy. It will be appreciated that the snubber capacitor 156 dissipates very little of this energy into heat, thereby increasing the efficiency of the power supply. Once the transistor 42 is fully off, the snubber inductor 38 absorbs the ringing, or the oscillating voltage, that would otherwise appear at the input terminal 40 of the switching transistor 42, thereby reducing the conducted emissions. The amount of power dissipated in the snubber inductor 38 is also small so as to dissipate very little heat, which allows for increased efficiency of the power supply.

When the transistor 42 begins to turn on again, the snubber inductor 38 initially represents a high impedance which slows down the turn on rate of the transistor 42 until the inductor 38 saturates. The snubber inductor 38 also prevents the transistor 42 from shorting the snubber capacitor 156 to the CONTROL COMMON when the transistor 42 begins to turn on again.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

What is claimed is:

1. A switched mode power supply, comprising:

means for providing a dc source voltage having a positive output terminal and a negative output terminal;

a transformer having a primary inductance having a first terminal and a second terminal and having a secondary inductance having a first terminal and a second terminal;

means connected to said first terminal and said second terminal of said secondary inductance for providing a regulated output voltage;

a capacitor connected between said first terminal and said second terminal of said primary inductance;

a metal-oxide-semiconductor field-effect transistor having a drain terminal, a source terminal, and a gate terminal;

an inductor connected in series between said second terminal of said primary inductance and said drain terminal of said transistor;

means for monitoring current through said primary inductance connected between said source of said transistor and said negative terminal of said dc source voltage; and means connected to said regulated output voltage, said means for monitoring current through said primary inductance, and said gate terminal of said transistor for providing a control signal to said gate of said transistor to turn on and off said transistor to cause switching action.

2. The power supply of claim 1, wherein said transformer further has an inductance coupled out of phase with said primary inductance, said out of phase inductance having a first terminal connected to said positive terminal of said dc source voltage; and said power supply further comprising:

a diode with the anode of said diode connected to said negative terminal of said dc source voltage and the cathode of said diode connected to said second terminal of said out of phase inductance.

* * * * *